(12) United States Patent
Smith et al.

(10) Patent No.: US 11,563,114 B2
(45) Date of Patent: *Jan. 24, 2023

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Matthew David Smith, Kawasaki (JP); Hiroshi Ono, Setagaya (JP); Yosuke Kajiwara, Yokohama (JP); Akira Mukai, Kawasaki (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 76 days.

This patent is subject to a terminal disclaimer.

(21) Appl. No.: 17/158,078

(22) Filed: Jan. 26, 2021

(65) Prior Publication Data
US 2022/0190150 A1 Jun. 16, 2022

(30) Foreign Application Priority Data
Dec. 16, 2020 (JP) .............................. JP2020-208394

(51) Int. Cl.
*H01L 29/778* (2006.01)
*H01L 29/423* (2006.01)

(52) U.S. Cl.
CPC ...... *H01L 29/7786* (2013.01); *H01L 29/4236* (2013.01); *H01L 29/42364* (2013.01)

(58) Field of Classification Search
CPC ............. H01L 29/7786; H01L 29/4236; H01L 29/42364
See application file for complete search history.

(56) References Cited

U.S. PATENT DOCUMENTS

| 9,653,613 B2 | 5/2017 | Yamazaki et al. |
| 10,290,614 B2 | 5/2019 | Then et al. |

(Continued)

FOREIGN PATENT DOCUMENTS

| JP | 2010-239064 A | 10/2010 |
| JP | 2011-192834 A | 9/2011 |

(Continued)

OTHER PUBLICATIONS

Kambayashi et al., "High-Power Normally-Off GaN MOSFET", ECS Transactions, 41 (8), 2011, 15 pages.

(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

According to one embodiment, a semiconductor device includes first, second, third electrodes, a semiconductor member, and a first compound member. The third electrode is between the first and second electrodes in a first direction from the first to second electrodes. The semiconductor member includes first and second semiconductor regions. The first semiconductor region includes first, second, third, fourth, and fifth partial regions. A second direction from the first partial region to the first electrode crosses the first direction. The fourth partial region is between the first and third partial regions in the first direction. The fifth partial region is between the third and second partial regions in the first direction. The second semiconductor region includes first and second semiconductor portions. The first compound member includes first, second and third compound regions.

23 Claims, 8 Drawing Sheets

(56) References Cited

U.S. PATENT DOCUMENTS

| | | |
|---|---|---|
| 2011/0019873 A1 | 1/2011 | Yamato |
| 2019/0019873 A1 | 1/2019 | Shiozaki et al. |
| 2020/0006521 A1 | 1/2020 | Banerjee et al. |
| 2021/0005730 A1* | 1/2021 | Mukai ............... H01L 29/42364 |
| 2021/0043750 A1* | 2/2021 | Neufeld .............. H01L 29/2003 |
| 2022/0123135 A1* | 4/2022 | Smith .................. H01L 29/205 |

FOREIGN PATENT DOCUMENTS

| | | |
|---|---|---|
| JP | 2016-164979 A | 9/2016 |
| JP | 2019-021753 A | 2/2019 |

OTHER PUBLICATIONS

Bahl et al., "Product-level Reliability of GaN Devices", IEEE International Reliability Physics Symposium (IRPS), Apr. 2016, 7 pages.

Yi et al., "High Performance Metal-Gate/High-κ GaN MOSFET With Good Reliability for Both Logic and Power Applications", IEEE Journal of the Electron Devices Society, 4 (5), 2016, pp. 246-252.

Tajima et al., "Improvement of electrical characteristics in regrown AlGaN/GaN MOSFETs by suppression of the residual interface charge", Journal of Crystal Growth 507, 2019, 4 pages.

Uenuma et al., "The Influence of Ga—OH Bond at Initial GaN Surface on the Electrical Characteristics of $SiO_2$/GaN Interface", Phys. Status Solidi B, 257, 1900368, 2020, 6 pages.

Xu et al., "Experimental and theoretical study on device-processing-incorporated fluorine in AlGaN/GaN heterostructures", AIP Advances 10, 065122, 2020, 5 pages.

Yamada et al., "Improved interface properties of GaN-based metal-oxide-semiconductor devices with thin Ga-oxide interlayers", Applied Physics Letters 110, 261603, 2017, 6 pages.

Kikuta et al., "Highly reliable AlSiO gate oxides formed through post-deposition annealing for GaN-based MOS devices", Applied Physics Express 13, 026504, 2020, 5 pages.

Kikuta et al., "$Al_2O_3$/$SiO_2$ nanolaminate for a gate oxide in a GaN-based MOS device", Journal of Vacuum Science & Technology A 35 (1), 01B122, 2017, 7 pages.

Bartos et al., "Electron band bending of polar, semipolar and non-polar GaN surfaces", Journal of Applied Physics 119, 105303, 2016, 8 pages.

Yang et al., "Surface band bending and band alignment of plasma enhanced atomic layer deposited dielectrics on Ga- and N-face gallium nitride", Journal of Applied Physics 116, 123702, 2014, 13 pages.

Sayed et al., "Net negative fixed interface charge for $Si_3N_4$ and $SiO_2$ grown in situ on 000-1 N-polar GaN", Applied Physics Letters 115, 032103, 2019, 6 pages.

Liu et al., "In situ metalorganic chemical vapor deposition of $Al_2O_3$ on N-face GaN and evidence of polarity induced fixed charge", Applied Physics Letters 104, 263511, 2014, 5 pages.

Hung et al., "Interface charge engineering at atomic layer deposited dielectric/III-nitride interfaces", Applied Physics Letters 102, 072105, 2013, 5 pages.

Hung et al., "Study of Interfacial Charge Properties and Engineering of ALD dielectric/III-Nitride Interfaces", CS Mantech Conference, 2013, 4 pages.

Asenov et al., "Increase in the Random Dopant Induced Threshold Fluctuations and Lowering in Sub-100 nm MOSFETs Due to Quantum Effects: A 3-D Density-Gradient Simulation Study", IEEE Transactions on Electron Devices, vol. 48, No. 4, Apr. 2001, pp. 722-729.

Pérez-Thomas et al., "Modeling the effect of thin gate insulators ($SiO_2$, SiN, $Al_2O_3$ and $HfO_2$) on AlGaN/GaN HEMT forward characteristics grown on Si, sapphire and SiC", Materials Science in Semiconductor Processing 16, 2013, pp. 1336-1345.

Song et al., "$SiO_2$ Etch Rate and Profile Control Using Pulse Power in Capacitively Coupled Plasmas", The $20^{th}$ International Symposium on Plasma Chemistry (ISPC-20), 2011, 4 pages.

Pavius et al., "Profile Angle control in $SiO_2$ Deep Anisotropic Dry Etching for MEMS Fabrication", $17^{th}$ IEEE International Conference on Micro Electro Mechanical Systesms, 2004, pp. 669-672.

Osipov et al., "Fabrication technology of GaN/AlGaN HEMT slanted sidewall gates using thermally reflowed ZEP resist and $CHF_3$/$SF_6$ plasma etching", CS Mantech Conference, 2013, 5 pages.

Tegen et al., "Etch Characteristics of $Al_2O_3$ in ICP and MERIE Plasma Etchers", Journal of Electrochemical Society, 152 (4), 2005, pp. G271-G276.

Bliznetsov et al., "Deep $SiO_2$ etching with Al and AlN masks for MEMS devices", Journal of Micromechanics and Microengineering 25, 087002, 2015, 9 pages.

* cited by examiner

FIG. 10B

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2020-208394, filed on Dec. 16, 2020; the entire contents of which are incorporated herein by reference.

FIELD

Embodiments described herein relate generally to a semiconductor device and a manufacturing method thereof.

BACKGROUND

There are semiconductor devices such as transistors that use nitride semiconductors. In semiconductor devices, improvement in characteristics is desired.

DETAILED DESCRIPTION

According to one embodiment, a semiconductor device includes a first electrode, a second electrode, a third electrode, a semiconductor member, and a first compound member. A position of the third electrode in a first direction from the first electrode to the second electrode is between a position of the first electrode in the first direction and a position of the second electrode in the first direction. The semiconductor member includes a first semiconductor region and a second semiconductor region. The first semiconductor region includes $Al_{x1}Ga_{1-x1}N$ ($0 \le x1 < 1$). The first semiconductor region includes a first partial region, a second partial region, a third partial region, a fourth partial region, and a fifth partial region. A second direction from the first partial region to the first electrode crosses the first direction. A direction from the second partial region to the second electrode is along the second direction. A direction from the third partial region to the third electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 \le 1$, $x1 < x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first compound member includes aluminum, silicon and oxygen. The first compound member includes a first compound region, a second compound region and a third compound region. The first compound region is between the fourth partial region and at least a part of the third electrode in the first direction. The second compound region is between the at least the part of the third electrode and the fifth partial region in the first direction. The third compound region is between the third partial region and the third electrode in the second direction. The first compound region includes a first face and a first side face. The first face faces the third partial region. The first side face faces the fourth partial region. A first angle between the first face and the first side face is less than 90 degrees.

According to one embodiment, a semiconductor device includes a first electrode, a second electrode, a third electrode, a semiconductor member, a first compound member, and an intermediate region. A position of the third electrode in a first direction from the first electrode to the second electrode is between a position of the first electrode in the first direction and a position of the second electrode in the first direction. The semiconductor member includes a first semiconductor region and a second semiconductor region. The first semiconductor region includes $Al_{x1}Ga_{1-x1}N$ ($0 \le x1 < 1$). The first semiconductor region includes a first partial region, a second partial region, a third partial region, a fourth partial region, and a fifth partial region. A second direction from the first partial region to the first electrode crosses the first direction. A direction from the second partial region to the second electrode is along the second direction. A direction from the third partial region to the third electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 \le 1$, $x1 < x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first compound member includes aluminum, silicon and oxygen. The first compound member includes a first compound region, a second compound region and a third compound region. The first compound region is between the fourth partial region and at least a part of the third electrode in the first direction. The second compound region is between the at least the part of the third electrode and the fifth partial region in the first direction. The third compound region is between the third partial region and the third electrode in the second direction. The intermediate region is between the third partial region and the third compound region. The intermediate region includes a first intermediate portion and a second intermediate portion. The second intermediate portion is between the first intermediate portion and the third compound region in the second direction. The first intermediate portion includes Ga, N, O and Al. The second intermediate portion includes Ga, N, O, Al and Si. The first intermediate portion does not include Si, or a concentration of Si at the first intermediate portion is lower than a concentration of Si at the second intermediate portion.

According to one embodiment, a method of manufacturing a semiconductor device is disclosed. The method can include preparing a first structure body. The first structure body includes a base semiconductor layer being a part of a semiconductor member, and a first compound member, the base semiconductor layer including $Al_{x3}Ga_{1-x3}N$ ($0 \leq x3 < 1$) and including an upper face, the first compound member being provided on the upper face and including aluminum, silicon, and oxygen. The method can include removing a part of the first compound member to expose a part of the base semiconductor layer. The method can include growing another part of the semiconductor member from the exposed part of the base semiconductor layer. The semiconductor member includes a first semiconductor region provided on the part of the base semiconductor layer and including $Al_{x1}Ga_{1-x1}N$ ($0 \leq x1 < 1$), and a second semiconductor region provided on the first semiconductor region and including $Al_{x2}Ga_{1-x2}N$ ($0 < x2 < 1$, $x1 < x2$, $x3 < x2$). The method can include making a hole in the first compound member after the growing the other part of the semiconductor member, and filling a conductive member in the hole.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
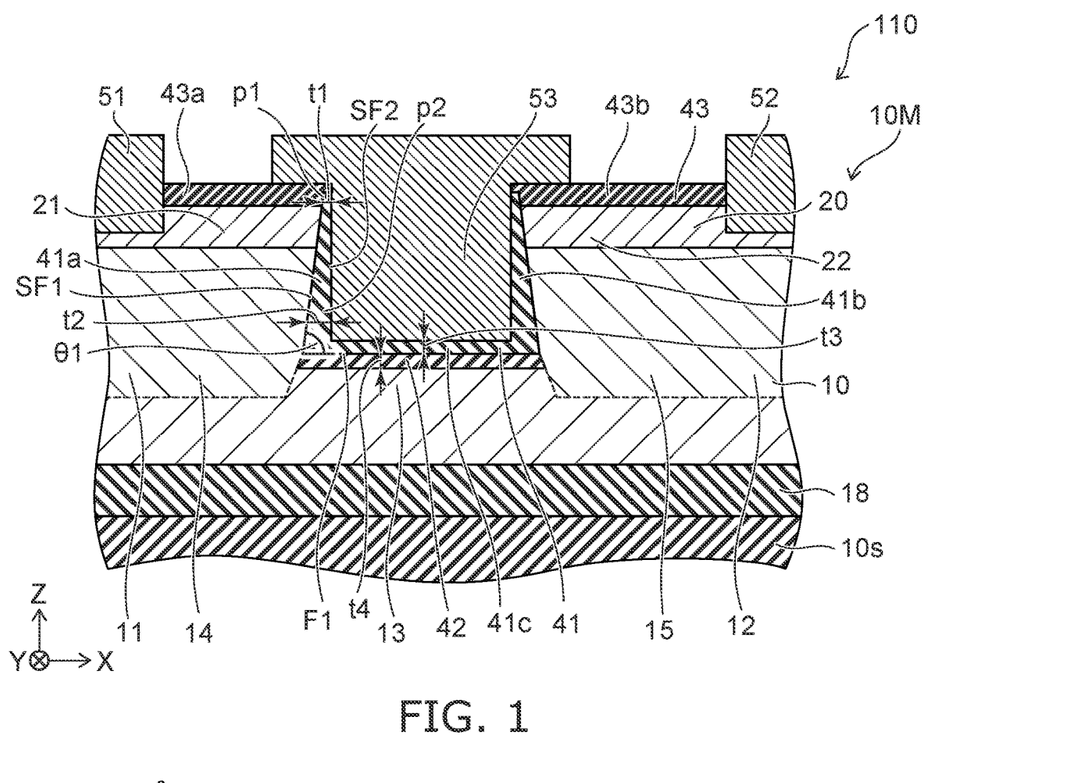
FIG. 1 is a schematic cross-sectional view illustrating a semiconductor device according to the first embodiment.

FIG. 1 is a schematic cross-sectional view illustrating the semiconductor device according to the first embodiment.

As shown in FIG. 1, the semiconductor device 110 according to the embodiment includes a first electrode 51, a second electrode 52, a third electrode 53, a semiconductor member 10M, and a first compound member 41. In this example, the semiconductor device 110 includes a second compound member 42. The second compound member 42 is provided as needed and may be omitted.

The direction from the first electrode 51 to the second electrode 52 is taken as a first direction. The first direction is, for example, an X-axis direction. One direction perpendicular to the X-axis direction is taken as the Z-axis direction. The direction perpendicular to the X-axis direction and the Z-axis direction is the Y-axis direction.

The position of the third electrode 53 in the first direction (X-axis direction) is between the position of the first electrode 51 in the first direction and the position of the second electrode 52 in the first direction. For example, at least a part of the third electrode 53 is between the first electrode 51 and the second electrode 52 in the first direction.

The semiconductor member 10M includes a first semiconductor region 10 and a second semiconductor region 20.

The first semiconductor region 10 includes $Al_{x1}Ga_{1-x1}N$ ($0 \leq x1 < 1$). The first semiconductor region 10 includes, for example, GaN. The Al composition ratio in the first semiconductor region 10 is, for example, not less than 0 and not more than 0.05.

The first semiconductor region 10 includes a first partial region 11, a second partial region 12, a third partial region 13, a fourth partial region 14 and a fifth partial region 15. The second direction from the first partial region 11 to the first electrode 51 crosses the first direction (X-axis direction). The second direction is, for example, the Z-axis direction.

The direction from the second partial region 12 to the second electrode 52 is along the second direction. The direction from the third partial region 13 to the third electrode 53 is along the second direction.

The position of the fourth partial region 14 in the first direction (X-axis direction) is between the position of the first partial region 11 in the first direction and the position of the third partial region 13 in the first direction. The position of the fifth partial region 15 in the first direction is between the position of the third partial region 13 in the first direction and the position of the second partial region 12 in the first direction. The partial areas are continuous, for example.

The second semiconductor region 20 includes $Al_{x2}Ga_{1-x2}N$ ($0 < x2 \leq 1$, $x1 < x2$). The second semiconductor region 20 includes, for example, AlGaN. The Al composition ratio in the second semiconductor region 20 is more than 0.05 and not more than 1, for example.

The second semiconductor region 20 includes a first semiconductor portion 21 and a second semiconductor portion 22. The direction from the fourth partial region 14 to the first semiconductor portion 21 is along the second direction (for example, the Z-axis direction). The direction from the fifth partial region 15 to the second semiconductor portion 22 is along the second direction.

The first compound member 41 includes aluminum, silicon, and oxygen. The first compound member 41 includes, for example, AlSiO. For example, the first compound member 41 includes $Al_{1-z2}Si_{z2}O$ ($0 < z2 < 1$). As described later, the Si composition ratio z2 in the first compound member 41 may be not less than 0.2 and not more than 0.8.

The first compound member 41 includes a first compound region 41a, a second compound region 41b, and a third compound region 41c. The first compound region 41a is between the fourth partial region 14 and at least a part of the third electrode 53 in the first direction (X-axis direction). The second compound region 41b is between the at least the part of the third electrode 53 and the fifth partial region 15 in the first direction. The third compound region 41c is between the third partial region 13 and the third electrode 53 in the second direction (Z-axis direction). These compound regions may be continuous with each other.

In the case where the second compound member 42 is provided, the second compound member 42 is provided between the third partial region 13 and the third compound region 41c in the second direction (Z-axis direction). The second compound member 42 includes gallium and oxygen. The second compound member 42 includes, for example, GaO. The second compound member 42 may include $GaO_x$, for example.

The current flowing between the first electrode 51 and the second electrode 52 is controlled by the potential of the third electrode 53. The potential of the third electrode 53 is, for example, a potential based on the potential of the first electrode 51. One of the first electrode 51 and the second electrode 52 is, for example, a source electrode. The other of the first electrode 51 and the second electrode 52 is, for example, a drain electrode. The third electrode 53 is, for example, a gate electrode. The second compound member 42 becomes, for example, a part of the gate insulating film. The first compound member 41 becomes, for example, another part of the gate insulating film. The semiconductor device 110 is, for example, a transistor. For example, the first semiconductor region 10 includes a portion facing the second semiconductor region 20. A carrier region (for example, a two-dimensional electron gas) is generated in this portion. The semiconductor device 110 is, for example, a HEMT (High Electron Mobility Transistor).

For example, the c-axis direction of the semiconductor member 10M is along the second direction (Z-axis direction). The angle between the c-axis direction and the Z-axis direction is not more than 10 degrees. The carrier region is formed due to the difference in composition between the first semiconductor region 10 and the second semiconductor region 20.

The first electrode 51 is electrically connected to the first semiconductor portion 21, for example. The second electrode 52 is electrically connected to the second semiconductor portion 22, for example.

As shown in FIG. 1, in the embodiment, the outer side face of the first compound region 41a has an inverse tapered shape. In this example, the outer side face of the second compound region 41b also has an inverse tapered shape.

For example, the first compound region 41a includes a first face F1 and a first side face SF1. The first face F1 faces the third partial region 13. In the case where the second compound region 42 is provided, the first face F1 faces the second compound member 42. The first side face SF1 faces the fourth partial region 14. An angle between the first face F1 and the first side face SF1 is a first angle θ1. The first angle θ1 is smaller than 90 degrees. The first angle θ1 may be not more than 88 degrees, for example. The first angle θ1 may be not more than 85 degrees, for example.

Thus, it was found that, for example, a high threshold value can be obtained by forming the outer side face of the first compound member 41 on the reverse taper. According to the embodiment, for example, it is possible to provide a semiconductor device whose characteristics can be improved.

Figure 2:
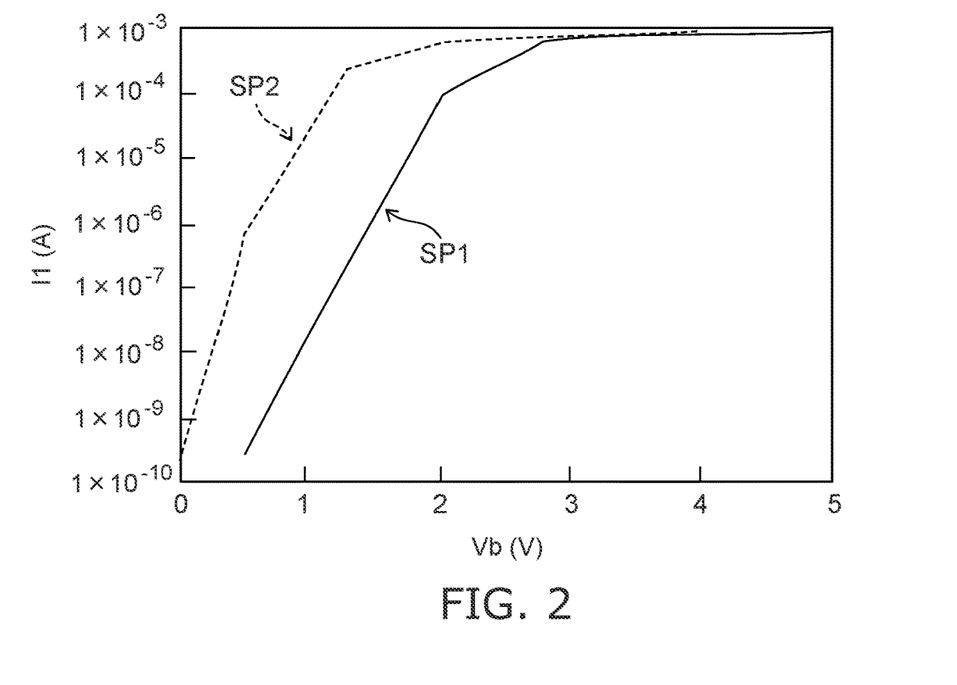
FIG. 2 is a graph illustrating the characteristics of the semiconductor device.

FIG. 2 is a graph illustrating the characteristics of the semiconductor device.

The horizontal axis of FIG. 2 is the bias voltage Vb applied to the third electrode 53. The bias voltage Vb is a voltage based on the potential of the first electrode 51. The vertical axis of FIG. 2 represents the current I1 flowing between the first electrode 51 and the second electrode 52. FIG. 2 illustrates the measurement results of the first sample SP1 and the second sample SP2. In the first sample SP1, the above first angle θ1 is smaller than 90 degrees. In the first sample SP1, the first angle θ1 is 85 degrees. In the second sample SP2, the first angle θ1 is larger than 90 degrees. In the second sample SP2, the first angle θ1 is 150 degrees.

As shown in FIG. 2, the threshold voltage in the first sample SP1 is higher than the threshold voltage in the second sample SP2. As described above, when the side face of the gate insulating film (for example, the first side face SF1 of the first compound region 41a) has an inverse tapered shape, a high threshold value can be obtained.

For example, when the side face of the gate insulating film (for example, the first side face SF1 of the first compound region 41a) has an inverse taper shape, for example, in the portion of the fourth partial region 14 facing the third electrode 53, the local potential is raised, and the current therefore becomes difficult to flow.

For example, the direction from the first semiconductor region 10 to the second semiconductor region 20 is along the +c-axis direction of the semiconductor member 10M. As a result, a carrier region is formed in a portion of the first semiconductor region 10 facing the second semiconductor region 20. For example, the carrier region is formed near the upper face of the fourth partial region 14. It is considered that when the first side face SF1 has an inversely tapered shape, polarization in the direction opposite to the +c-axis direction occurs in the portion of the fourth partial region 14 facing the third electrode 53. It is considered that this makes it difficult for current to flow in the portion of the fourth partial region 14 that faces the first semiconductor portion 21, because the current path to the drain is blocked in the gate region.

As shown in FIG. 1, the first compound region 41a includes a first portion p1 and a second portion p2. The position of the second portion p2 in the second direction (Z-axis direction) is between the position of the third compound region 41c in the second direction and the position of the first portion p1 in the second direction. The first portion p1 is, for example, a top portion. The second portion p2 is, for example, a bottom portion.

The thickness (length) along the first direction (X-axis direction) of the first portion p1 is defined as the first thickness t1. The thickness (length) of the second portion p2 along the first direction is defined as a second thickness t2. The first thickness t1 is thinner than the second thickness t2. Since the second thickness t2 is thick, the threshold voltage can be increased more stably.

For example, the thickness (length) along the second direction (for example, the Z-axis direction) of the third compound region 41c is set as the third thickness t3. The third thickness t3 is different from the second thickness t2. In an example, the second thickness t2 is thicker than the third thickness t3.

The first thickness t1 is, for example, not less than 2 nm, and not more than 30 nm. The second thickness t2 is, for example, not less than 5 nm, and not more than 100 nm. The third thickness t3 is, for example, not less than 5 nm, and not more than 100 nm. For example, the second portion p2 contacts the third compound region 41c. The other outer side face of the first compound region 41a faces the fifth partial region 15. The angle between the other outer side face and the first side face F1 may be substantially same as the first angle θ1.

As shown in FIG. 1, for example, the third compound region 41c contacts the second compound member 42. The first compound region 41a contacts the fourth partial region 14 and at least a part of the third electrode 53 described above. The second compound region 41b contacts the fifth partial region 15 and at least a part of the third electrode 53 described above.

In the embodiment, the thickness t4 of the second compound member 42 along the second direction (Z-axis direction) is, for example, not less than 0.1 nm, and not more than 30 nm. When the thickness t4 of the second compound member 42 is not more than 0.5 nm, low interface state density can be obtained, for example. When the thickness t4 of the second compound member 42 is not more than 30 nm, high switching performance (transconductance) can be obtained, for example. The thickness t4 may be, for example, not less than 0.1 nm and not more than 0.5 nm. Even by the thin second compound member 42, for example, the interface state density in the vicinity of the interface between the second compound region 42 and the third partial region 13 is reduced. For example, the threshold voltage can be stabilized.

As shown in FIG. 1, the semiconductor device 110 may include a third compound member 43. The third compound member 43 includes silicon and nitrogen. The third compound member 43 includes, for example, silicon nitride. At least a part of the third compound member 43 includes, for example, $Si_3N_4$. The third compound member 43 includes a first insulating portion 43a and a second insulating portion 43b. The first semiconductor portion 21 is between the fourth partial region 14 and the first insulating portion 43a in the second direction (Z-axis direction). The second semiconductor portion 22 is between the fifth partial region 15 and the second insulating portion 43b in the second direction. For example, the semiconductor member 10M is protected by the third compound member 43. Higher stability is obtained.

As shown in FIG. 1, the semiconductor member 10M may include a base body 10s and a buffer layer 18. The substrate 10s includes at least one selected from the group consisting of silicon, silicon carbide, sapphire, aluminum nitride and gallium nitride, for example. The buffer layer 18 is provided on the base body 10s. The buffer layer 18 includes, for example, a nitride semiconductor. The first semiconductor region 10 is provided on the buffer layer 18. The second semiconductor region 20 is provided on the first semiconductor region 10.

Figure 3:
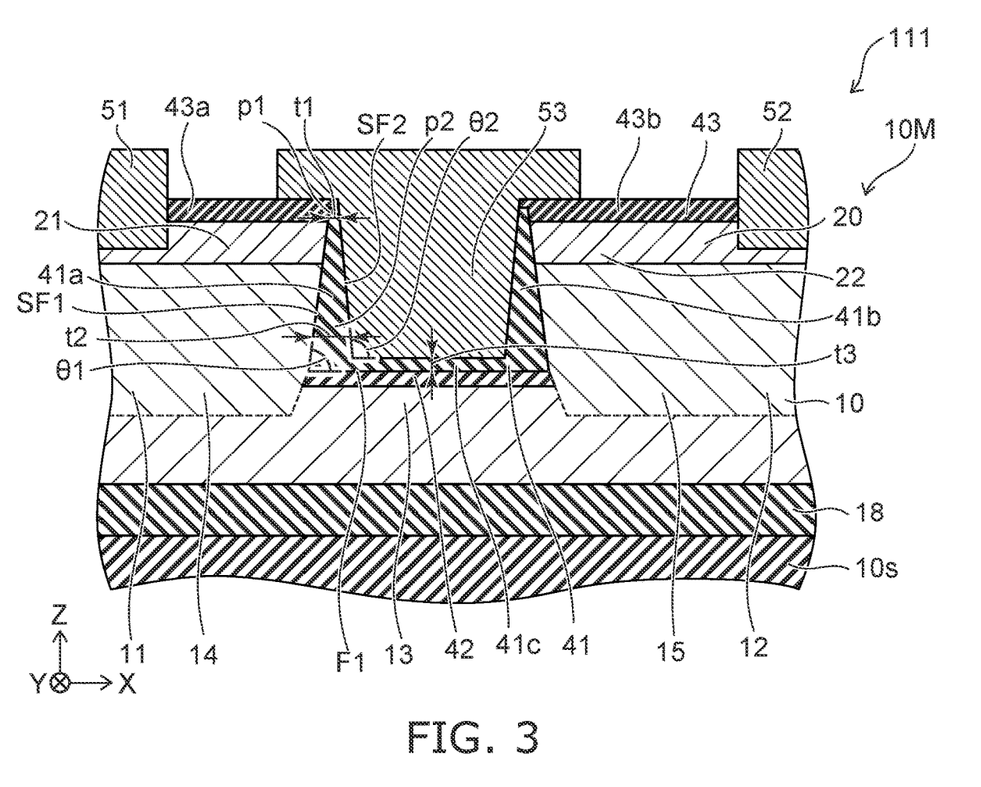
FIG. 3 is a schematic cross-sectional view illustrating the semiconductor device according to the first embodiment.

FIG. 3 is a schematic cross-sectional view illustrating the semiconductor device according to the first embodiment.

As shown in FIG. 3, in the semiconductor device 111 according to the embodiment, the shape of the side face of the first compound member 41 is different from the shape of the side face of the first compound member 41 in the semiconductor device 110. The configuration of the semiconductor device 111 other than this may be the same as the configuration of the semiconductor device 110.

In the semiconductor device 111, the first compound region 41a includes the second side face SF2. The second side face SF2 faces at least a part of the third electrode 53 in the first direction (X-axis direction).

The angle between the second side face SF2 and the first side face F1 is the second angle θ2. The second angle θ2 is larger than 90 degrees. The second side face SF2 has, for example, a forward tapered shape.

Due to such second side face SF2, the first thickness t1 is thinner than the second thickness t2. Since the second thickness t2 is thick, the threshold voltage can be increased more stably. The second angle θ2 is, for example, not less than 92 degrees. The second angle θ2 may be, for example, not less than 95 degrees.

In the semiconductor device 111, a high threshold value can be obtained more stably. According to the semiconductor device 111, it is possible to provide a semiconductor device having improved characteristics.

Figure 4A:
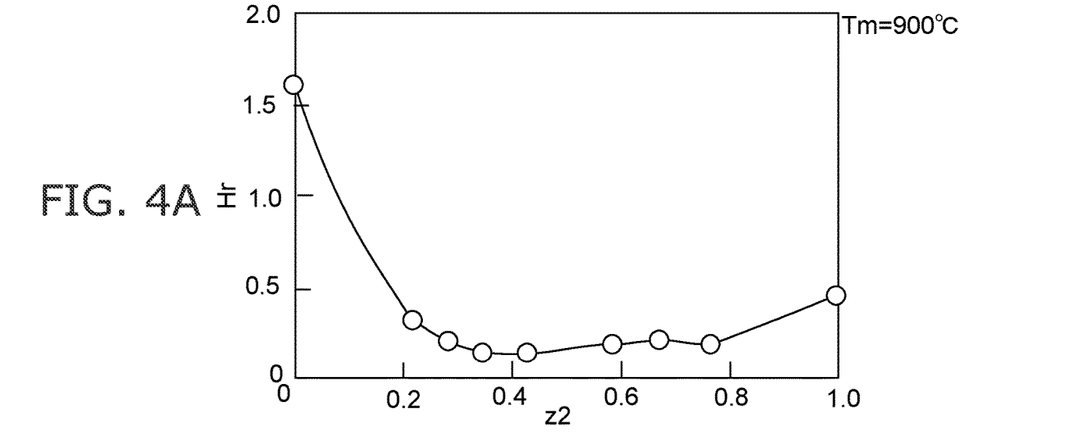
FIGS. 4A to 4C are graphs illustrating the characteristics of the semiconductor device.
Figure 4B:
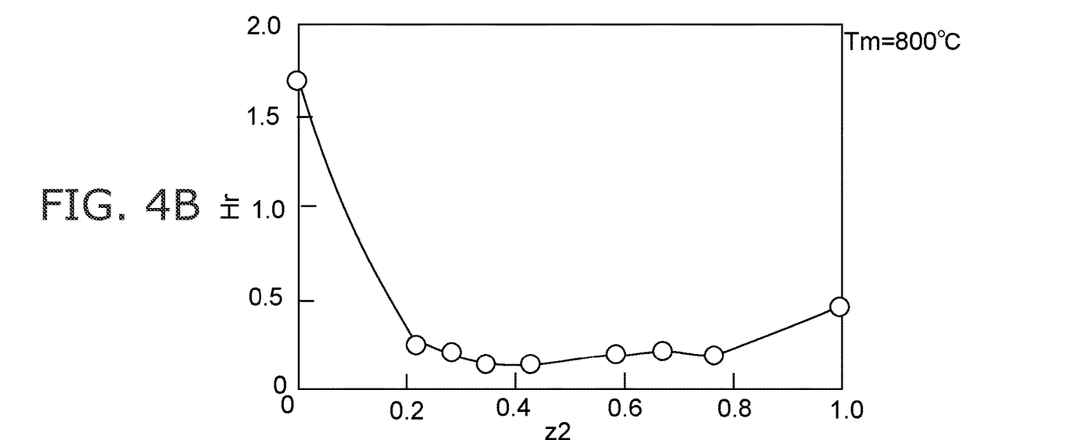
Figure 4C:
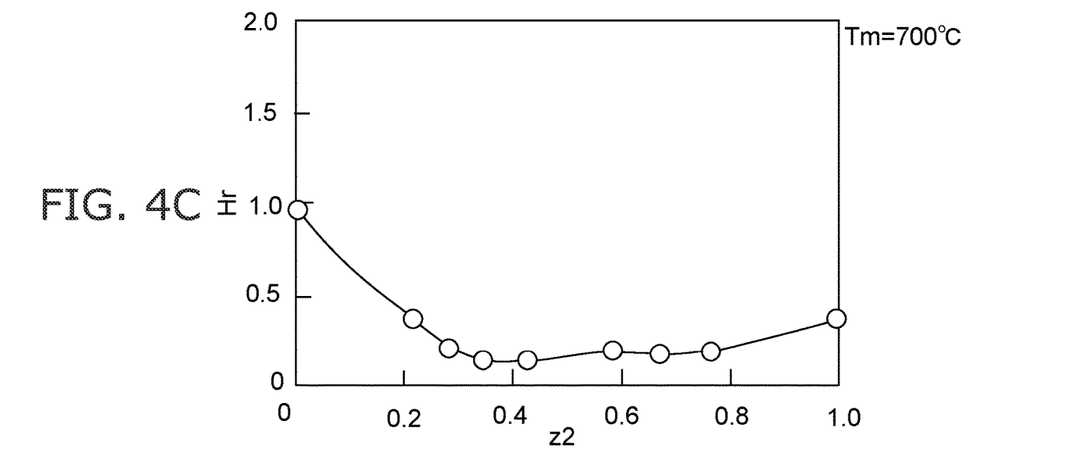

FIGS. 4A to 4C are graphs illustrating the characteristics of the semiconductor device.

These figures illustrate an experimental result of characteristics when the Si composition ratio in the first compound member 41 is changed. In these figures, a temperature Tm of a heat treatment after the forming the first compound member 41 is changed. In FIG. 4A, the temperature Tm is 900° C. In FIG. 4B, the temperature Tm is 800° C. In FIG. 4C, the temperature Tm is 700° C. The first compound member 41 includes $Al_{1-z2}Si_{z2}O$. The horizontal axis represents the Si composition ratio z2. When the Si composition ratio z2 is 1, the first compound member 41 includes $SiO_2$. When the Si composition ratio z2 is 0, the first compound member 41 includes $Al_2O_3$. The vertical axis represents a hysteresis Hr (relative value). The hysteresis Hr is the characteristic of the capacitance between the semiconductor member 10M and the third electrode 53 when the bias voltage Vb is increased, and the capacitance between the semiconductor member 10M and the third electrode 53 when the bias voltage Vb is decreased. It corresponds to the difference between the characteristics of the electric capacitance between the two.

As can be seen from FIGS. 4A to 4C, when the Si composition ratio z2 is not less than 0.2 and not more than 0.8, a small hysteresis Hr is obtained. For example, when the Si composition ratio z2 is not less than 0.22 and not more than 0.77, a small hysteresis Hr is obtained. In the embodiment, the Si composition ratio z2 is preferably not less than 0.2 and not more than 0.8. In the embodiment, the Si composition ratio z2 may be not less than 0.22 and not more than 0.77. For example, a small hysteresis is obtained. The Si composition ratio z2 may be not less than 0.23, for example. When the composition ratio z2 of Si is not less than 0.2, a small hysteresis Hr can be obtained regardless of the heat treatment temperature Tm. High heat resistance can be obtained.

In the embodiment, the first compound member 41 described above is provided. With such a structure, more stable characteristics can be obtained. By providing the second compound member 42, more stable characteristics can be obtained.

Figure 5:
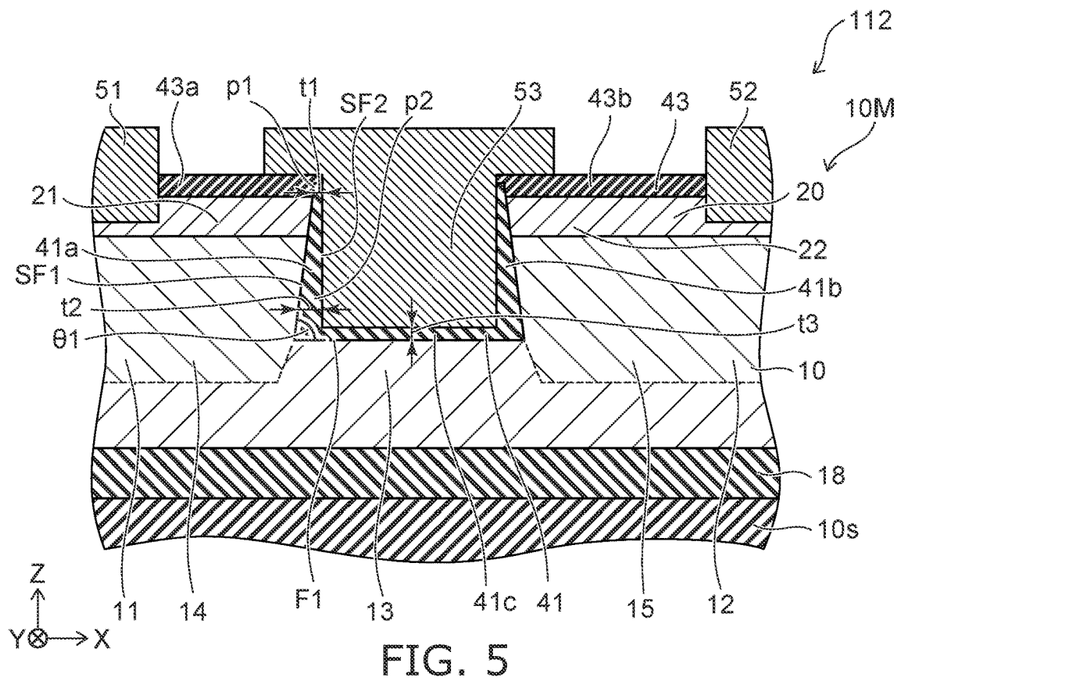
FIG. 5 is a schematic cross-sectional view illustrating a semiconductor device according to the first embodiment.

FIG. 5 is a schematic cross-sectional view illustrating the semiconductor device according to the first embodiment.

As shown in FIG. 5, in the semiconductor device 112 according to the embodiment, the second compound member is omitted. Other configurations of the semiconductor device 112 may be the same as those of the semiconductor device 110. The characteristics of the semiconductor device 112 can also be improved. In the semiconductor device 111 illustrated in FIG. 3, the second compound member 42 may be omitted.

In the embodiment, the first electrode 51 and the second electrode 52 include, for example, at least one selected from the group consisting of Ti, Al, Ni, Au, Mo, Pt, Pd, W, Cu, Cr. The third electrode 53 includes, for example, at least one selected from the group consisting of TiN, Ni, Pt, Au, Cr, Al, Mo, W, Cu.

Figure 6:
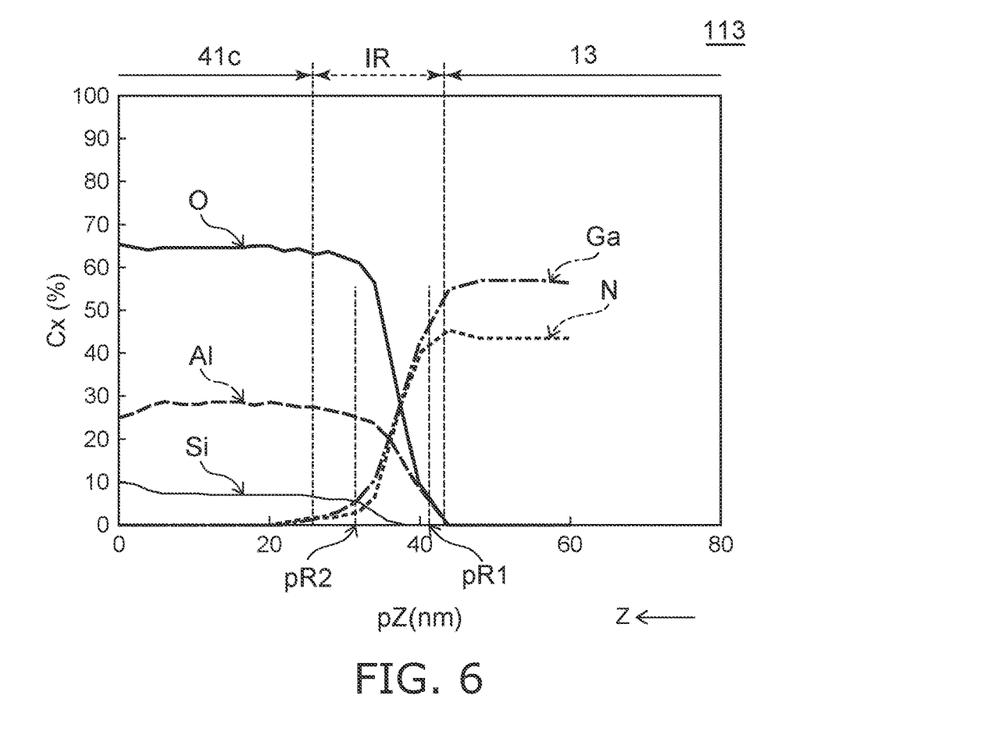
FIG. 6 is a graph illustrating the characteristics of the semiconductor device.

FIG. 6 is a graph illustrating an example of a semiconductor device according to the first embodiment.

FIG. 6 shows an example of an element profile in the semiconductor device 113 according to the embodiment. The semiconductor device 113 may have any of the configurations of the above-mentioned semiconductor devices 110 to 112. In the semiconductor device 113, a first semiconductor region 10 including a third partial region 13 and a first compound member 41 including a third compound region 41c are provided (see FIGS. 1, 3 and 5 and the like). The second compound member 42 may be provided in the semiconductor device 113. In the semiconductor device 113, the configurations of the first electrode 51, the second electrode 52, the third electrode 53, the semiconductor member 10M, and the first compound member 41 may be the same as any of the configurations of the semiconductor devices 110 to 112.

FIG. 6 shows the XPS (X-ray Photoelectron Spectroscopy) analysis results of the region including the third partial region 13 and the third compound region 41c. The horizontal axis of FIG. 6 is the position pZ along the Z-axis direction. The vertical axis is the concentration Cx of the element. FIG. 6 shows the concentrations Cx of Ga, Al, N, Si and O.

As shown in FIG. 6, the semiconductor device 113 may include an intermediate region IR. The intermediate region IR is between the third partial region 13 and the third compound region 41c. At least a part of the intermediate region IR may be at least a part of the second compound member 42.

The intermediate region IR includes a first intermediate portion pR1 and a second intermediate portion pR2. The second intermediate portion pR2 is between the first intermediate portion pR1 and the third compound region 41c in the second direction (Z-axis direction).

As shown in FIG. 6, the composition may be different between the first intermediate portion pR1 and the second intermediate portion pR2. For example, the concentration of Al may be different between the first intermediate portion pR1 and the second intermediate portion pR2. For example, the concentration of Si may be different between the first intermediate portion pR1 and the second intermediate portion pR2.

For example, the first intermediate portion pR1 includes Ga, N, O and Al. The second intermediate portion pR2 includes Ga, N, O, Al and Si. For example, the first intermediate portion pR1 does not include Si. Alternatively, the concentration of Si at the first intermediate portion pR1 is lower than the concentration of Si at the second intermediate portion pR2.

For example, at the first intermediate portion pR1 near the third partial region 13, the high concentration of Si can maintain high crystal quality in the third partial region 13. For example, it is easier to obtain a lower on-resistance. The characteristics can be further improved.

Second Embodiment

The second embodiment relates to a semiconductor device manufacturing method.

Figure 7:
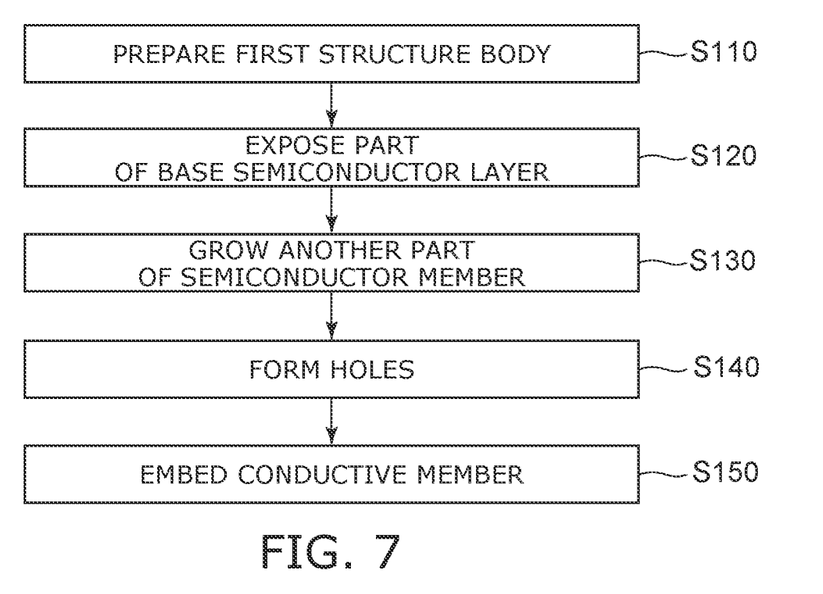
FIG. 7 is a flowchart illustrating a method for manufacturing a semiconductor device according to a second embodiment.

FIG. 7 is a flowchart illustrating the method for manufacturing a semiconductor device according to the second embodiment. FIGS. 8A to 8C, FIGS. 9A to 9C, FIGS. 10A and 10B illustrate the method for manufacturing a semiconductor device according to the second embodiment.

As shown in FIG. 7, the method for manufacturing a semiconductor device according to the embodiment includes steps S110 to S150. In step S110, the first structure body is prepared. The first structure body includes a base semiconductor layer including a part of a semiconductor member 10M. In step S120, a part of the base semiconductor layer is exposed. In step S130, another part of the semiconductor member 10M is grown. In step S140, holes are formed. In step S150, the conductive member is embedded.

Figure 8A:
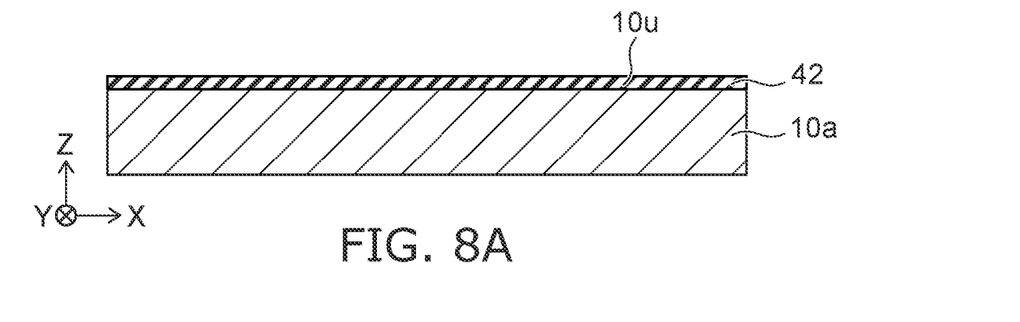
FIGS. 8A to 8C are schematic cross-sectional views illustrating the method for manufacturing a semiconductor device according to the second embodiment.

For example, as shown in FIG. 8A, in this example, the second compound member 42 is formed on the upper face 10u of the base semiconductor layer 10a. The base semiconductor layer 10a includes, for example, $Al_{x3}Ga_{1-x3}N$ ($0 \leq x3 < 1$). The second compound member 42 includes gallium, and oxygen. The second compound member 42 is formed, for example, by sputtering, chemical vapor deposition or atomic layer deposition.

Figure 8B:
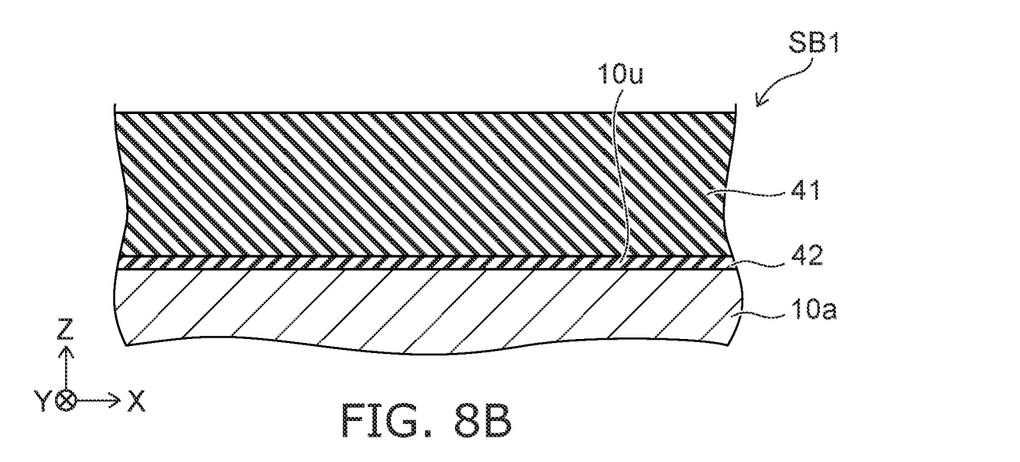

For example, as shown in FIG. 8B, the first compound member 41 is formed on the second compound member 42. The first compound member 41 includes aluminum, silicon, and oxygen. The first compound member 41 is formed, for example, by sputtering, chemical vapor deposition or atomic layer deposition.

By this, the first structure body SB1 is formed. The first structure body SB1 includes a base semiconductor layer 10a including $Al_{x3}Ga_{1-x3}N$ ($0 \leq x3 < 1$) and including an upper face 10u. The first structure body SB1 includes the first compound member 41 provided on the upper face 10u. The first compound member 41 includes aluminum, silicon, and oxygen. The first structure SB1 may include the second compound member 42. The second compound member 42 is provided between the upper surface 10u and the first compound member 41. The second compound member 42 includes gallium and oxygen.

As described above, the preparation of the first structure body SB1 may include forming the second compound member 42 on the base semiconductor layer 10a. The preparation of the first structure body SB1 may include forming the first compound member 41 on the second compound member 42.

Figure 8C:
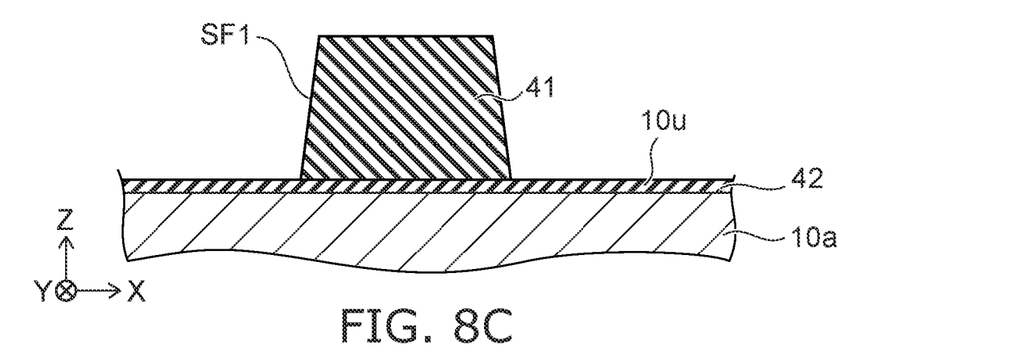

As shown in FIG. 8C, a part of the first compound member 41 is removed. The side face of the remaining first compound member 41 has a forward tapered shape. In this way, the first side face SF1 of the first compound member 41 formed by removing a part of the first compound member 41 is inclined in a forward tapered shape with respect to the upper face 10u.

Figure 9A:
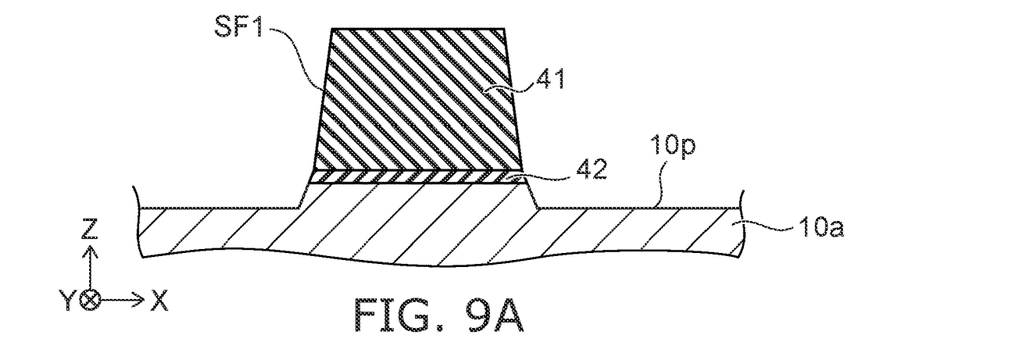
FIGS. 9A to 9C are schematic cross-sectional views illustrating the method for manufacturing a semiconductor device according to the second embodiment.

As shown in FIG. 9A, a part of the second compound member 42 is removed to expose a part 10p of the base semiconductor layer 10a.

Figure 9B:
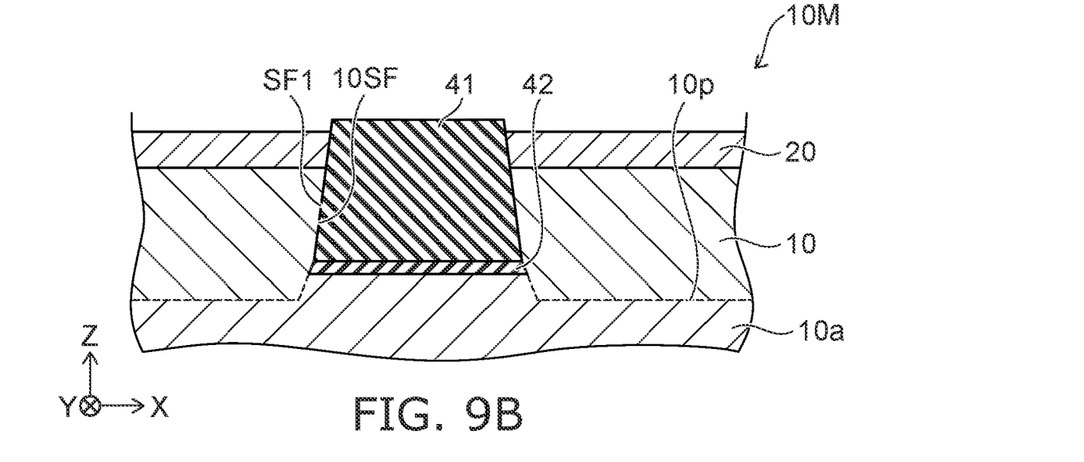

As shown in FIG. 9B, another part of the semiconductor member 10M is grown from the exposed part 10p of the base semiconductor layer 10a. The other part of the semiconductor member 10M includes the first semiconductor region 10 including $Al_{x1}Ga_{1-x1}N$ ($0 \leq x1 < 1$) provided on the part 10p of the base semiconductor layer 10a. The other part of the semiconductor member 10M includes a second semiconductor region 20 provided on the first semiconductor region 10. The second semiconductor region 20 includes $Al_{x2}Ga_{1-x2}N$ ($0 < x2 < 1$, $x1 < x2$, $x3 < x2$).

As shown in FIG. 9B, the side face 10SF of the other part of the semiconductor member 10M faces the first side face SF1. The side face 10SF of the other part of the semiconductor member 10M has an inverse tapered shape.

Figure 9C:
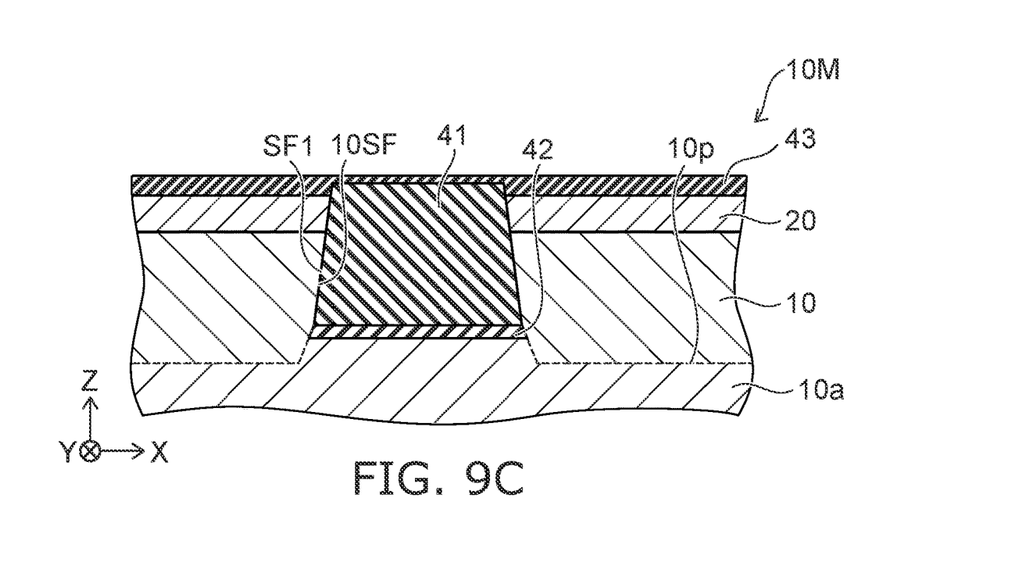

As shown in FIG. 9C, a third compound member 43 including silicon and nitrogen is further formed.

Figure 10A:
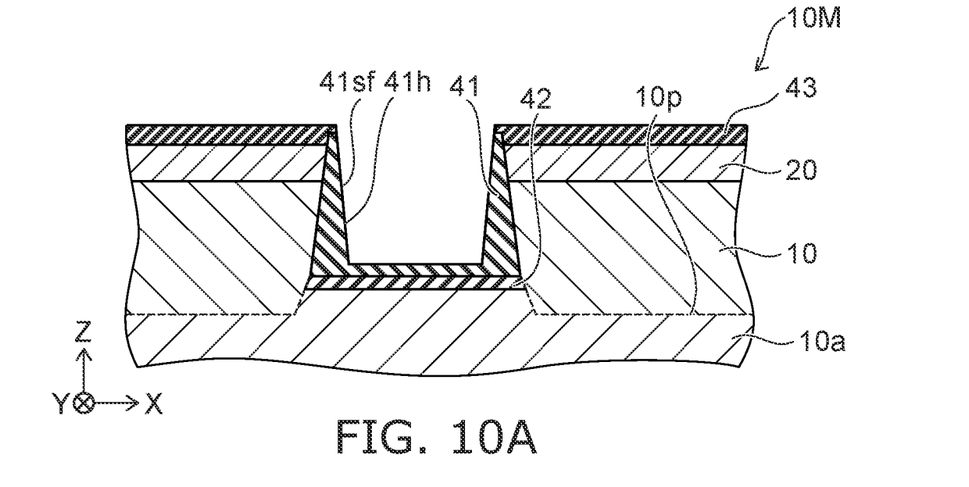
FIGS. 10A and 10B are schematic cross-sectional views illustrating the method for manufacturing a semiconductor device according to the second embodiment.

As shown in FIG. 10A, a hole 41h is formed in the first compound member 41 after the growth of the other part of the semiconductor member 10M. For example, the side face 41sf of the hole 41h is inclined in a forward tapered shape.

Thus, in this example, the method of manufacturing the semiconductor device may include forming the third compound member 43 on the other part of the semiconductor member 10M after the growth of the other part of the semiconductor member 10M and before the formation of the hole 41h.

Figure 10B:
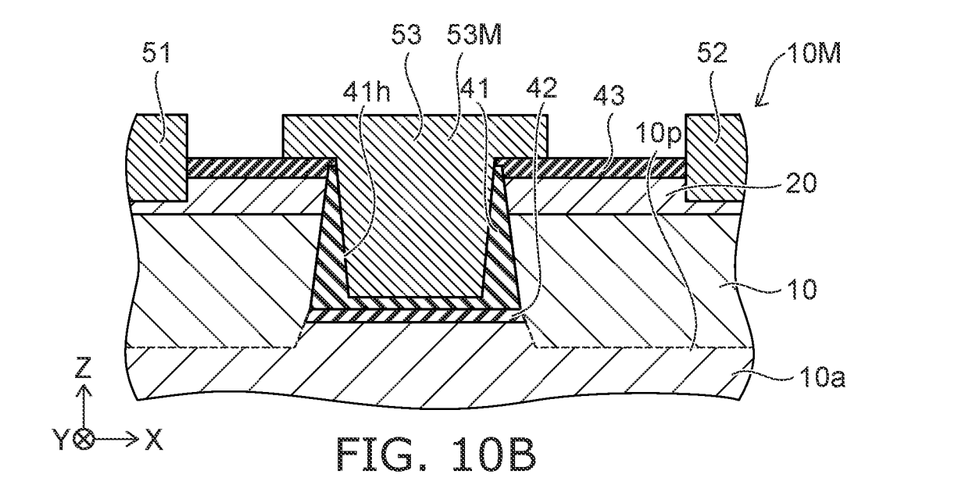

As shown in FIG. 10B, the hole 41h is filled with the conductive member 53M. As a result, the third electrode 53 is formed. For example, a part of the third compound member 43 is removed to form the first electrode 51 and the second electrode 52. Thereby, for example, the semiconductor device 111 is obtained.

According to the method of manufacturing a semiconductor device according to the embodiment, it is possible to provide a method of manufacturing a semiconductor device that can improve characteristics.

In the above manufacturing method, the second compound member 42 does not have to be formed by sputtering, CVD, atomic deposition, or the like. The first compound member 41 may be formed on the base semiconductor layer 10a, and the second compound member 42 may be formed by heat treatment or the like. In this case, the thickness of the second compound member 42 (for example, the thickness t4) may be not less than 0.1 nm and not more than 0.8 nm (for example, not less than 0.1 nm and not more than 0.5 nm).

In the embodiment, for example, the thickness of the first compound member 41 (for example, the third thickness t3) and the thickness of the second compound member 42 (for example, the thickness t4), and the like may be obtained by electron microscope observation. The thickness of the first compound member 41 (for example, the third thickness t3), the thickness of the second compound member 42 (for example, the thickness t4), and the like may be obtained by the strength profile obtained from XPS.

According to the embodiment, it is possible to provide a semiconductor device capable of improving characteristics and a method for manufacturing the same.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, nitride members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first electrode;
    a second electrode;
    a third electrode, a position of the third electrode in a first direction from the first electrode to the second electrode being between a position of the first electrode in the first direction and a position of the second electrode in the first direction;
    a semiconductor member including a first semiconductor region and a second semiconductor region,
        the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and
        the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction;
    a first compound member including aluminum, silicon and oxygen, the first compound member including a first compound region, a second compound region and a third compound region, the first compound region being between the fourth partial region and at least a part of the third electrode in the first direction, the second compound region being between the at least the part of the third electrode and the fifth partial region in the first direction, the third compound region being between the third partial region and the third electrode in the second direction, the first compound region including a first face and a first side face, the first face facing the third partial region, the first side face facing the fourth partial region, a first angle between the first face and the first side face being less than 90 degrees; and
    a second compound member being provided between the third partial region and the third compound region in the second direction comprising an insulating material including gallium and oxygen.

2. The device according to claim 1, wherein the first angle is not more than 85 degrees.

3. The device according to claim 1, wherein
the third electrode includes a second face adjacent to the third partial region and a second side face disposed between the fourth partial region and the second face, and
a second angle between the second side face and the first face is greater than 90 degrees.

4. The device according to claim 3, wherein the second angle is not less than 95 degrees.

5. The device according to claim 1, wherein
the first compound region includes a first portion and a second portion,
a position of the second portion in the second direction is between a position of the third compound region in the second direction and a position of the first portion in the second direction, and
a first thickness of the first compound member in the first portion along the first direction is smaller than a second thickness of the first compound member in the second portion along the first direction.

6. The device according to claim 5, wherein a third thickness of the third compound region along the second direction is different from the first thickness.

7. The device according to claim 6, wherein the second thickness is thicker than the third thickness.

8. The device according to claim 5, wherein the second portion is in contact with the third compound region.

9. The device according to claim 1, wherein the first compound member includes $Al_{1-x2}Si_{z2}O$ ($0.2 \leq z2 \leq 0.8$).

10. The device according to claim 1, wherein the first compound region is in contact with the fourth partial region and the at least the part of the third electrode.

11. The device according to claim 1, wherein the second compound member comprises GaO.

12. The device according to claim 11, wherein the third compound region is in contact with the second compound member.

13. The device according to claim 1, further comprising a third compound member including silicon and nitrogen,
the third compound member including a first insulating portion and a second insulating portion,
the first semiconductor portion being between the fourth partial region and the first insulating portion in the second direction, and
the second semiconductor portion being between the fifth partial region and the second insulating portion in the second direction.

14. A semiconductor device comprising:
a first electrode;
a second electrode;
a third electrode, a position of the third electrode in a first direction from the first electrode to the second electrode being between a position of the first electrode in the first direction and a position of the second electrode in the first direction;
a semiconductor member including a first semiconductor region and a second semiconductor region,
the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the third electrode being along the second direction,
a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and
the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction;
a first compound member including aluminum, silicon and oxygen, the first compound member including a first compound region, a second compound region and a third compound region, the first compound region being between the fourth partial region and at least a part of the third electrode in the first direction, the second compound region being between the at least the part of the third electrode and the fifth partial region in the first direction, the third compound region being between the third partial region and the third electrode in the second direction; and
an intermediate region being between the third partial region and the third compound region, the intermediate region including a first intermediate portion and a second intermediate portion, the second intermediate portion being between the first intermediate portion and the third compound region in the second direction, the first intermediate portion including Ga, N, O and Al, the second intermediate portion including Ga, N, O, Al and Si, the first intermediate portion not including Si, or a concentration of Si at the first intermediate portion being lower than a concentration of Si at the second intermediate portion.

15. A method of manufacturing a semiconductor device, the method comprising:
preparing a first structure body, the first structure body including a base semiconductor layer being a part of a semiconductor member, and a first compound member, the base semiconductor layer including $Al_{x3}Ga_{1-x3}N$ ($0 \leq x3 < 1$) and including an upper face, the first compound member being provided on the upper face and including aluminum, silicon, and oxygen;
removing a part of the first compound member to expose a part of the base semiconductor layer,
growing another part of the semiconductor member from the exposed part of the base semiconductor layer, the semiconductor member including a first semiconductor region provided on the part of the base semiconductor layer and including $Al_{x1}Ga_{1-x1}N$ ($0 \leq x1 < 1$), and a second semiconductor region provided on the first semiconductor region and including $Al_{x2}Ga_{1-x2}N$ ($0 < x2 < 1$, $x1 < x2$, $x3 < x2$);
making a hole in the first compound member after the growing the other part of the semiconductor member; and
filling a conductive member in the hole.

16. The method according to claim 15, wherein a first side face of the first compound member formed by the removing the part of the first compound member is inclined in a forward taper shape with respect to the upper face.

17. The method according to claim 16, wherein
a side face of the other part of the semiconductor member faces the first side face,
the side face of the other part of the semiconductor member has an inverse tapered shape.

18. The method according to claim 15, wherein a side face of the hole is inclined in a forward tapered shape.

19. The method according to claim 15, wherein
the first structure body includes a second compound member provided between the upper face and the first compound member,
the second compound member includes gallium and oxygen, and
the exposing the part of the base semiconductor layer includes removing a part of the second compound member to expose the part of the base semiconductor layer.

20. The method according to claim 15, further comprising:
forming a third compound member including silicon and nitrogen on the semiconductor member after the growing the other part of the semiconductor member and before the forming the hole.

21. A semiconductor device comprising:
a first electrode;
a second electrode;
a third electrode, a position of the third electrode in a first direction from the first electrode to the second electrode being between a position of the first electrode in the first direction and a position of the second electrode in the first direction;
a semiconductor member including a first semiconductor region and a second semiconductor region,
the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and
the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction; and
a first compound member including aluminum, silicon and oxygen, the first compound member including a first compound region, a second compound region and a third compound region, the first compound region being between the fourth partial region and at least a part of the third electrode in the first direction, the second compound region being between the at least the part of the third electrode and the fifth partial region in the first direction, the third compound region being between the third partial region and the third electrode in the second direction, the first compound region including a first face and a first side face, the first face facing the third partial region, the first side face facing the fourth partial region, a first angle between the first face and the first side face being less than 90 degrees, wherein
the third electrode includes a second face adjacent to the third partial region and a second side face disposed between the fourth partial region and the second face, and
a second angle between the second side face and the first face is greater than 90 degrees.

22. A semiconductor device comprising:
a first electrode;
a second electrode;
a third electrode, a position of the third electrode in a first direction from the first electrode to the second electrode being between a position of the first electrode in the first direction and a position of the second electrode in the first direction;
a semiconductor member including a first semiconductor region and a second semiconductor region,
the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and
the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction; and
a first compound member including aluminum, silicon and oxygen, the first compound member including a first compound region, a second compound region and a third compound region, the first compound region being between the fourth partial region and at least a part of the third electrode in the first direction, the second compound region being between the at least the part of the third electrode and the fifth partial region in the first direction, the third compound region being between the third partial region and the third electrode in the second direction, the first compound region including a first face and a first side face, the first face facing the third partial region, the first side face facing the fourth partial region, a first angle between the first face and the first side face being less than 90 degrees, wherein the first compound region includes a first portion and a second portion, a position of the second portion in the second direction is between a position of the third compound region in the second direction and a position of the first portion in the second direction, and a first thickness of the first compound member in the first portion along the first direction is smaller than a second thickness of the first compound member in the second portion along the first direction.

23. A semiconductor device comprising:

a first electrode;

a second electrode;

a third electrode, a position of the third electrode in a first direction from the first electrode to the second electrode being between a position of the first electrode in the first direction and a position of the second electrode in the first direction;

a semiconductor member including a first semiconductor region and a second semiconductor region, the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction; and a first compound member including aluminum, silicon and oxygen, the first compound member including a first compound region, a second compound region and a third compound region, the first compound region being between the fourth partial region and at least a part of the third electrode in the first direction, the second compound region being between the at least the part of the third electrode and the fifth partial region in the first direction, the third compound region being between the third partial region and the third electrode in the second direction, the first compound region including a first face and a first side face, the first face facing the third partial region, the first side face facing the fourth partial region, a first angle between the first face and the first side face being less than 90 degrees, wherein the third electrode includes a second face and a second side face, the second face faces the third partial region in the second direction, a part of the second side face faces the first semiconductor portion in the first direction, and a second angle between the second side face and the first face is greater than 90 degrees.

* * * * *